United States Patent [19]

May

[11] 4,400,663
[45] Aug. 23, 1983

[54] SHUNT FAULT TESTER FOR MULTICONDUCTOR CABLE

[75] Inventor: Paul H. May, Whippany, N.J.

[73] Assignee: Bell Telephone Laboratories, Incorporated, Murray Hill, N.J.

[21] Appl. No.: 315,665

[22] Filed: Oct. 28, 1981

[51] Int. Cl.³ .......................... G01R 31/08; H04B 3/46
[52] U.S. Cl. .............................. 324/52; 179/175.3 R; 179/175.3 F
[58] Field of Search ................................. 324/51, 52; 179/175.3 R, 175.3 F

[56] References Cited

U.S. PATENT DOCUMENTS 3,812,303  5/1974  Stewart .................. 179/175.3 R

FOREIGN PATENT DOCUMENTS 543892  5/1977  U.S.S.R. ............................ 324/52
602887  4/1978  U.S.S.R. ............................ 324/52
658505  4/1979  U.S.S.R. ............................ 324/52

OTHER PUBLICATIONS

Maloney: "Locating Cable Faults"–IEEE Trans. on Industry Appl. Jul./Aug. 1973–pp. 380–394.

Primary Examiner—Stanley T. Krawczewicz
Assistant Examiner—Jose M. Solis
Attorney, Agent, or Firm—R. O. Nimtz

[57] ABSTRACT

Apparatus, and associated methodology, for locating a resistive shunt fault between wires of a cable utilizes the virtual interconnection property of operational amplifier means (112) to cause the coalescing of geographically separated nodes within the cable system. The various embodiments employ the amplifier means in conjunction with an ohmmeter (111) or current source (114)—voltmeter (113) combination and, when necessary, a good conductor (GOOD) which parallels the wires under test, to produce an estimate of the resistance ($R_1$) of one wire between the fault point and a measurement position.

9 Claims, 6 Drawing Figures

SHUNT FAULT TESTER FOR MULTICONDUCTOR CABLE

TECHNICAL FIELD

This invention relates generally to detecting faults in multiconductor cable and, more particularly, to circuitry and associated methodology for locating a high resistance fault shunting a pair of conductors.

BACKGROUND OF THE INVENTION

In telecommunication systems, customer service is generally provided over transmission cables comprising numerous conductors contained within a protective shield which includes a low resistance, continuous metallic layer. From time to time, a resistive shunt fault occurs that may trace to manufacturing defects or, more usually, to damage during cable usage and the presence of moisture in the cable. Such faults, because of their service affecting nature, must be located and repaired.

Conventionally, the first step in locating such a fault, which resistively couples two or more conductors, is that of making reflectometer or bridge-type measurements on the faulted conductors, typically from both ends of the cable section affected by the fault. The objective is to provide an approximate distance to the fault, that is, the fault is "localized." The fault may then be precisely located with portable test equipment that utilizes tracing tones.

High resistance shunt faults have proven to be particularly difficult to localize because they cause only a minor perturbation on the transmission characteristics of the medium and, therefore, sensitive test apparatus is required. Moreover, conventional bridge measurements rely on the availability of a nonfaulted wire of known resistance or a good pair. When all other pairs in the cable are working pairs or faulted (e.g., pulp cable saturated with water), bridge measurements may be impractical.

The article entitled "Locating Cable Faults," by C. A. Maloney, *IEEE Transactions on Industry Applications,* July/August 1973, presents a discussion of representative prior art techniques utilized to locate resistive shunt faults. The conventional bridge techniques, and usual variations thereon, are discussed on pages 385 and 386. Time domain reflectometer (TDR) techniques are presented on pages 387 and 388.

With a bridge technique, one conductor from the faulted pair of conductors is connected so that the conductor sections on either side of the fault become legs of the bridge. The fault is generally placed in series with the bridge supply voltage. Another conductor (or conductors) is (are) required to connect the far end of the faulted conductor back to the bridge's instrumentation. The return wire(s) must be good for accurate measurements and some measurements require the good wire to be the same length and gauge as the faulted wire.

A reflectometer measures the time required for a pulse to be reflected from the fault. High resistance faults reflect very little energy and it is difficult to distinguish reflections from other discontinuities such as gauge changes and bridged taps.

SUMMARY OF THE INVENTION

The prior art shortcomings, deficiencies and limitations are obviated, in accordance with the present invention, by improved cable testing circuitry, and associated methods, that locate a high resistance fault shunting a plurality of conductors.

Broadly speaking, the illustrative embodiments in accordance with the present invention utilize the high gain and impedance properties of an operational amplifier to produce a virtual interconnection between nodes of a distributed parameter system—the cable—wherein these nodes are typically geographically dispersed. For instance, the inverting input node and noninverting input node of the operational amplifier may be arranged so that these nodes are virtually connected when embedded in a circuit. Moreover, a resistance negligibly small with respect to the amplifier's input impedance may be connected in series with each input node without destroying the virtual connection property and each input node is reflected through the resistance. In this way, if an operational amplifier node is connected to one end of a cable conductor, it is possible to reflect an end point condition on this conductor to intermediate points within the span of the cable and even to the other end of the conductor run if required.

The organization and operation of this invention will be better understood from a consideration of the detailed description of illustrative embodiments thereof, which follows, when taken in conjunction with the accompanying drawing.

DETAILED DESCRIPTION

Figure 1:
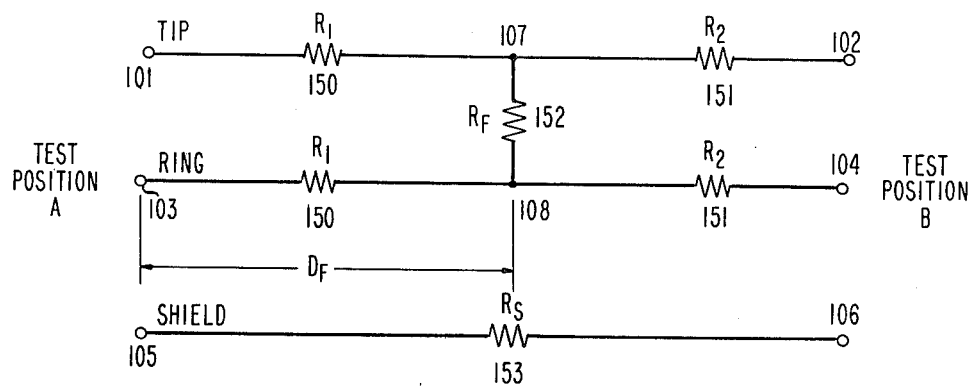
FIG. 1 is a general representation of a shunt-type fault which couples a pair of conductors in a cable at a fault point along the span of the cable pair under test.

A lumped, three-wire transmission line representation of a faulted pair for both DC and low frequency AC is shown in FIG. 1. In particular, the line is represented by TIP conductor, having end-point nodes 101 and 102, respectively, RING conductor with end nodes 103 and 104 and the SHIELD conductor with terminal nodes 105 and 106. A shunt fault resistance $R_F$, represented by resistor 152, couples the TIP-RING pair at nodes 107 and 108, respectively. Nodes 101, 103 and 105 appear at the same location along the faulted pair and this location is designated TEST POSITION A. Similarly, nodes 102, 104 and 106 appear at a location called TEST POSITION B. Nodes 107 and 108 appear at an unknown distance, shown as $D_F$, from TEST POSITION A. The low-frequency equivalent resistance $R_1$ of each faulted conductor between TEST POSITION A and the fault point is represented by resistor 150. In addition, the low-frequency resistance $R_2$ between the fault location and TEST POSITION B is represented by resistor 151. Finally, the low-frequency resistance $R_S$ of the SHIELD between TEST LOCATIONS A and B is represented by resistor 153. Both $R_1$ and $R_2$ are unknown prior to fault location measurements. Once $R_1$ is determined from measurements, and presuming the gauge of the faulted pair is known, the electrical distance $D_F$ may be estimated.

Figure 2:
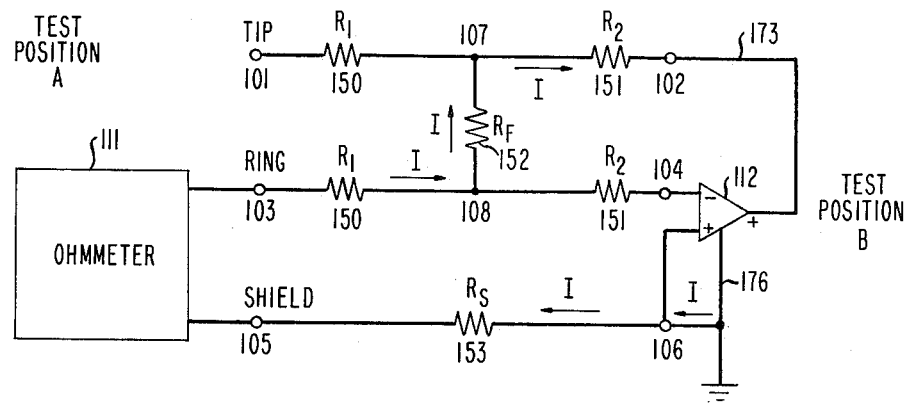
FIG. 2 depicts one arrangement of circuitry for locating the shunt fault of FIG. 1 in accordance with the principles of the present invention.

The basic principles of the present invention are depicted by the illustrative embodiment of FIG. 2, wherein the model of FIG. 1 is now shown with ohmmeter 111 connected between RING node 103 and SHIELD node 105 at TEST POSITION A and with operational amplifier 112 connected at TEST POSITION B. Amplifier 112 has its inverting (−) input connected to RING node 104, its noninverting (+) input to SHIELD node 106 and its output to RING node 102. Furthermore, the common point of amplifier 112, which is floating with respect to the ground of the transmission line system, is depicted by lead 176 and is also connected to SHIELD node 106.

If it is assumed that amplifier 112 is essentially an ideal amplifier at the frequencies of interest, that is, the amplifier gain is large and the input impedance across its input terminals is large, then the voltage difference across input terminals 104 and 106 is essentially zero and no current flows in RING node 104. Under these conditions, SHIELD node 106 and fault node 108 on the RING become virtually the same point, that is, a virtual connection couples nodes 106 and 108. Current I, flowing into RING node 103 from ohmmeter 111, then follows the series path through: RING resistor $R_1$; fault resistor $R_F$; TIP resistor $R_2$; amplifier 112 output lead 173, amplifier 112 common via lead 176; and SHIELD resistor $R_S$. If the voltage drop across resistor $R_S$ is negligible, ohmmeter 111, in effect, measures resistance $R_1$ of the RING because node 105 is also virtually connected to node 108. In practice, ohmmeter 111 measures the sum $R_1 + R_S$, but since the cable type and distance between test locations are known parameters, the ohmmeter reading may be corrected to account for the error due to the resistance of the SHIELD.

The arrangement of FIG. 2 depicts the basic technique for applying the virtual connection principle of an operational amplifier to cable fault location. If a good wire is available, even though its gauge is not uniform or its resistance is not known, measurement inaccuracies caused by the SHIELD can be virtually eliminated by the connection arrangement shown in FIG. 3. A conductor labeled GOOD, having end terminals 109 and 110, interconnects TEST POSITIONS A and B. The lumped, low-frequency equivalent resistance $R_G$ of this conductor is represented by series resistor 154 and remains an unknown parameter throughout testing. As long as resistance $R_G$ is negligibly small compared to the input impedance of amplifier 112, ohmmeter 111 does not measure sheath resistance $R_S$. This is true since both the inverting (−) input of amplifier 112, which is connected to RING node 104, and the noninverting (+) input, which is connected to GOOD node 110 at TEST POSITION B, do not draw current. Thus, fault node 108 and GOOD node 109 are virtually connected by the feedback effects of amplifier 112. Ohmmeter 111, which is connected between RING node 103 and GOOD node 109 at TEST POSITION A, measures only resistance $R_1$ of the RING conductor. Ohmmeter 111 is also connected to SHIELD node 105, via shorting strap 177 connected between nodes 105 and 109, so that the current path for current I produced by ohmmeter 111 is the same series path as discussed with respect to FIG. 2.

Figure 3:
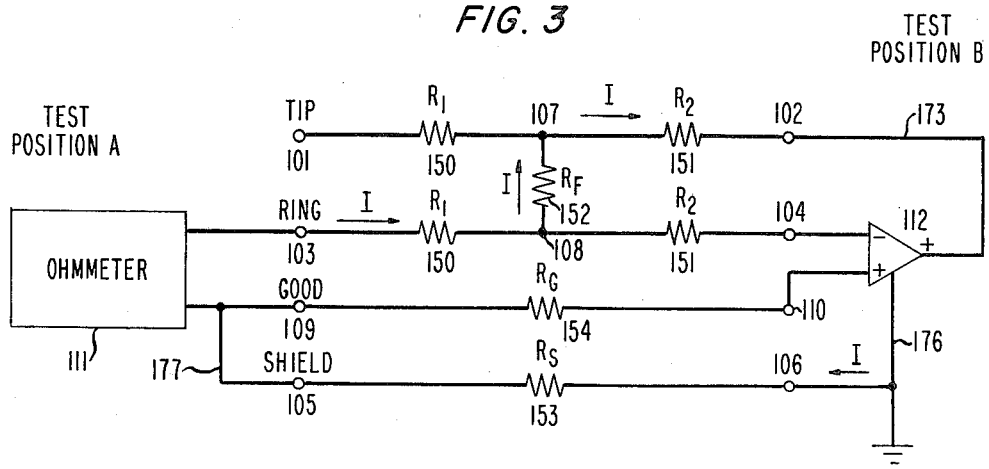
FIG. 3 depicts another arrangement of the devices utilized in FIG. 2 to eliminate measurement effects caused by the SHIELD whenever a GOOD conductor is available.
Figure 4:
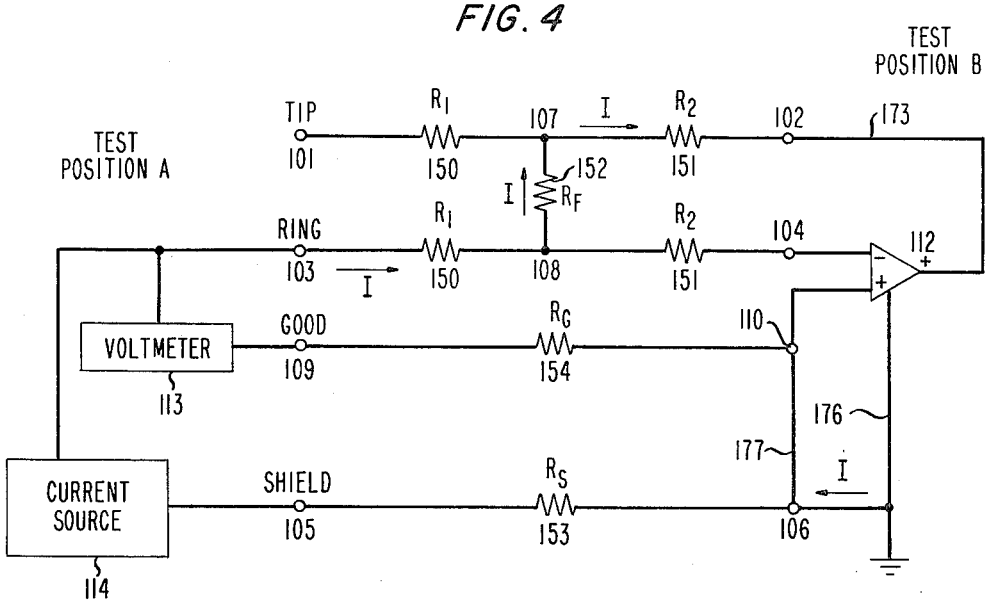
FIG. 4 depicts a variation on the arrangement of FIG. 3 for the case wherein the ohmmeter comprises a current source and a high impedance voltmeter.

Another way to remove the SHIELD from the measurement when a GOOD conductor is available is depicted in FIG. 4. The circuitry of FIG. 4 is a variation on the arrangement of FIG. 3 for the case wherein ohmmeter 111 now comprises current source 114 and a high impedance voltmeter 113. Source 114 is connected across RING node 103 and SHIELD node 105 and supplies current I between these nodes. Strap 177 connects nodes 110 and 106. Because of the virtual interconnection effect of amplifier 112 and negligible voltage drop across $R_G$, GOOD nodes 109, 110 and fault node 108 coalesce. It is apparent that voltmeter 113, which measures the voltage at RING node 103 with respect to GOOD node 109, can be calibrated to read resistance or distance directly. The flow of current I follows the same series path described above.

Figure 5:
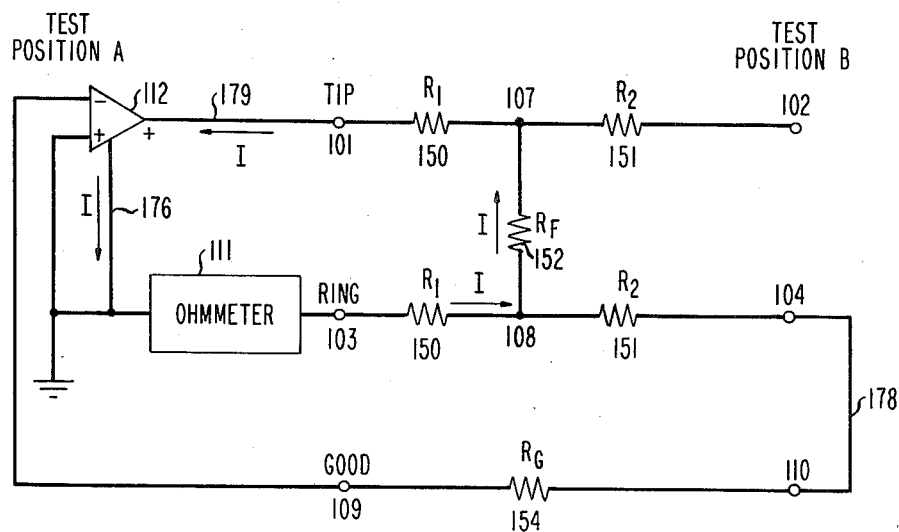
FIG. 5 illustrates yet another arrangement of the devices used in FIG. 3 indicating that the devices may be located solely at one TEST POSITION.

FIG. 5 shows one more variation to the arrangement of amplifier 112 and ohmmeter 111 to eliminate SHIELD resistance effects from the measurement whenever a GOOD conductor is available. In particular, amplifier 112 and ohmmeter 111 may be located at the same test position, shown as TEST POSITION A in FIG. 5. Now, the output of amplifier 112 is connected to TIP node 101, whereas the inverting input connects to GOOD node 109; and the noninverting input, as well as amplifier common 176, connect to one side of ohmmeter 111. The other side of ohmmeter 111 links to RING node 103. At TEST POSITION B, strap 178 interconnects RING node 104 and GOOD node 110. By the virtual coupling effect of amplifier 112, nodes 104, 108, 109, and 110 merge into amplifier common 176, and ohmmeter 111 measures only RING resistance $R_1$. The current I flowing from ohmmeter 111 transverses the series path comprising RING resistance $R_1$, fault resistance $R_F$, TIP resistance $R_1$, amplifier 112 output via lead 179 and common lead 176.

Figure 6:
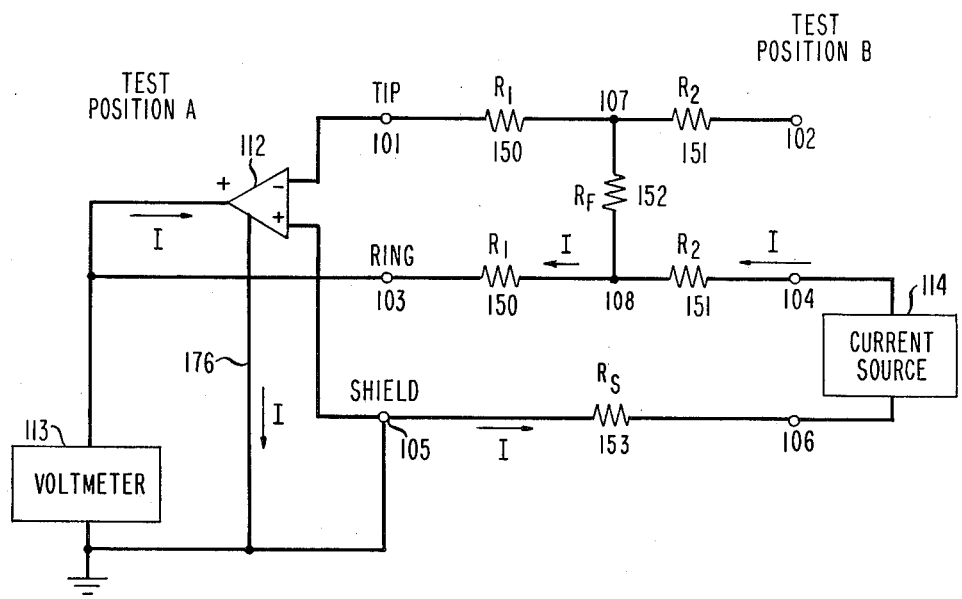
FIG. 6 depicts an arrangement of a current source, a voltmeter and an operational amplifier applied to the network of FIG. 1 wherein a good conductor is not required and the effects of the SHIELD on the measurement are eliminated.

The various arrangements of FIGS. 2-5 have focused on the deployment of an operational amplifier in combination with an ohmmeter and, in the special case of the circuitry of FIG. 4, the ohmmeter was described in terms of a current source and a voltmeter. If these last two elements are deployed in a manner depicted in FIG. 6, it is possible to measure faulted conductor resistance directly without the aid of a GOOD wire nor without the deleterious effects of SHIELD resistance or its equivalent (e.g., earth return). In particular, at TEST POSITION B, current source 114 interconnects RING node 104 with SHIELD node 106 to drive current I into node 104. At TEST POSITION A, the inverting input to amplifier 112 is connected to TIP node 101, the noninverting input to SHIELD node 105, and the output to RING node 103. In addition, common lead 176 of amplifier 112 is shorted to node 105 and voltmeter 113 measures the voltage between nodes 103 and 105. Due to the feedback effects of amplifier 112, nodes 101 and 105 coalesce, and since no current flows through fault resistance $R_F$, nodes 107 and 108 merge into nodes 101 and 105. Voltmeter 113 directly measures the voltage drop across RING resistance $R_1$; meter 113 may be calibrated, given a preselected value I flowing from source 114, to read resistance directly. It is easily visualized that the measurement devices may be rearranged to measure TIP resistance $R_1$ or interchanged between TEST POSITIONS A and B to measure resistance $R_2$ of the TIP and RING. The circuit arrangement of FIG. 6 has an additional advantage in that the test current does not flow through fault resistance $R_F$ so the output voltage swing required of amplifier 112 is less than for the other arrangements.

The fault resistance $R_F$ can also be removed from the test current path and placed in series with the amplifier input in the arrangements of FIGS. 2, 3, 4 and 5. In FIGS. 2 and 3, the ohmmeter connection to node 103 would be moved to node 101. In FIG. 4, both the current source and the voltmeter would connect to node 101 instead of node 103. This would measure $R_1$ of the TIP rather than $R_1$ of the RING. To measure $R_1$ of the RING, simply exchange the connections between the amplifier output and inverting input in all FIGS. FIG. 5 requires that the output of amplifier 112 be connected to node 109 and the inverting input (−) be connected to node 101.

It is to be further understood that the cable pair testing arrangements, and associated methodology, described herein is not limited to the specific forms disclosed by way of example and illustration, but may assume other embodiments limited only by the scope of the appended claims.

What is claimed is:

1. Apparatus (FIG. 2) to test a wire pair (TIP, RING) from a multiconductor cable having a shield (SHIELD) for a resistive shunt fault ($R_F$) located between first (A) and second (B) test positions and for determining the resistance ($R_1$) of one wire (RING) between said fault and said first test position, said apparatus CHARACTERIZED BY:
    means at said first position comprising an ohmmeter (111) connected between said one wire (103) and said shield (105), and
    means at said second position comprising operational amplifier means (112) having its noninverting (+) input connected to said shield (106), its inverting (−) input connected to said one wire (104), its output connected to the other wire (102) from said pair and its common (176) connected to said shield (106),
    wherein the output of said ohmmeter is indicative of said resistance.

2. Apparatus (FIG. 6) to test a wire pair (TIP,RING) from a multiconductor cable having a shield (SHIELD) for a resistive shunt fault ($R_F$) located between first (A) and second (B) test positions and for determining the resistance ($R_1$) of one wire (RING) between said fault and said first test position, said apparatus CHARACTERIZED BY:
    means at said first position comprising
    a voltmeter (113) connected between said one wire (103) and said shield (105), and
    operational amplifier means (112) having its noninverting (+) input connected to said shield (105), its inverting (−) input connected to the mate of said one wire (101), its output connected to said one wire (103) and its common (176) connected to said shield (105), and
    means at said second position comprising a current source (114) connected between said one wire (104) and said shield (106),
    wherein the output of said voltmeter is indicative of said resistance.

3. Apparatus (FIG. 3) to test a wire pair (TIP, RING) from a multiconductor cable having a shield (SHIELD) and at least one other conductor (GOOD) paralleling said pair for a resistive shunt fault ($R_F$) located between first (A) and second (B) test positions and for determining the resistance ($R_1$) of one wire (RING) between said fault and said first test position, said apparatus CHARACTERIZED BY:
    means at said first position comprising an ohmmeter (111) connected between said one wire (103) and the said shield (105) and means (177) for shorting said other conductor (109) to said shield (105), and
    means at said second position comprising operational amplifier means (112) having its noninverting (+) input connected to said conductor (110), its inverting (−) input connected to said one wire (104), its output connected to the other wire (102) from said pair, and its common (176) connected to said shield (106),
    wherein the output of said ohmmeter is indicative of said resistance.

4. Apparatus (FIG. 4) to test a wire pair (TIP, RING) from a multiconductor cable having a shield (SHIELD) and at least one other conductor (GOOD) paralleling said pair for a resistive shunt fault ($R_F$) located between first (A) and second (B) test positions and for determining the resistance ($R_1$) of one wire (RING) between said fault and said first test position, said apparatus CHARACTERIZED BY:
    means at said first position comprising:
    a voltmeter (113) connected between said one wire (103) and said other conductor (109), and
    a current source (114) connected between said one wire (103) and said shield (105), and
    means at said second position comprising
    means (177) for shorting said other conductor (110) to said shield (106), and
    operational amplifier means (112) having its noninverting (+) input connected to said conductor (110), its inverting (−) input connected to said one wire (104), its output connected to the other wire (102) from said pair, and its common (176) connected to said shield (106),
    wherein the output of said voltmeter is indicative of said resistance.

5. Apparatus (FIG. 5) to test a wire pair (TIP, RING) from a multiconductor cable having a shield (SHIELD) and at least one other conductor (GOOD) paralleling said pair for a resistive shunt fault ($R_F$) located between first (A) and second (B) test positions and for determining the resistance ($R_1$) of one wire (RING) between said fault and said first test position, said apparatus CHARACTERIZED BY:
    means at said first position comprising:
    operational amplifier means (112) having its noninverting (+) input connected to its common (176), its inverting (−) input connected to said other conductor (109), and its output connected to the other wire (101) of said pair, and
    an ohmmeter (111) connected between said one wire (103) and said common, and
    means at said second position for shorting said one wire (104) to said conductor (110),
    wherein the reading of said ohmmeter is indicative of said resistance.

6. Apparatus as recited in claims 1, 3 or 5 wherein said ohmmeter operates at a single, low frequency and is frequency selective.

7. Apparatus as recited in claims 2 or 4 wherein said current source operates at a single, low frequency and said voltmeter is frequency selective.

8. Apparatus (FIG. 6) to estimate the location of a shunt fault ($R_F$) along a pair of conductors (TIP, RING) spanning two test positions (A and B), each of said conductors having a terminal node (101,102 and 103,104) accessible at each of said test positions and a corresponding fault node (107 and 108) associated with said fault, said test positions being interconnected with an electrical path (SHIELD) having an end node (105 and 106) accessible at each of said test positions, said apparatus

CHARACTERIZED BY:

first means (114), located at the first of said test positions (B) and connected to one said terminal node (104) and said end node (106), for supplying constant current between said one said terminal node (104) and said end node (106), second means (112), located at the second of said test positions (A) and connected to each said terminal node (101 and 103) and said end node (105), for virtually interconnecting each said fault node (107 and 108) with one said terminal node (101) and said end node (105), and for providing a current path between the other said terminal node (103) and said end node (105), and third means (113), located at said second of said test positions, for measuring the voltage generated between said end node (105) and said other said node (103) due to said constant current, wherein said voltage is indicative of the resistance of one of said conductors between said second of said test positions and said fault.

9. Apparatus (FIG. 2) to estimate the location of a shunt fault ($R_F$) along a pair of conductors (TIP,RING), spanning two test positions (A and B), each of said conductors having a terminal node (101,102 and 103,104) accessible at each of said test positions and a corresponding fault node (107 and 108) associated with said fault, said test positions being interconnected with an electrical path (SHIELD) having an end node (105 and 106) accessible at each of said test positions, said apparatus

CHARACTERIZED BY:

first means (111), located at the first of said test positions (A) and connected to one said terminal node (103) and said end node (105), for measuring the resistance between said one said terminal node (103) and said end node (105), and second means (112), located at the other of said test positions (B) and connected to each said terminal node (102 and 104) and said end node (106), for virtually interconnecting one said fault node (108) with one said terminal node (104) and said end node (106) and for providing an electrical path between the other said terminal node (102) and said end node (106), wherein said resistance comprises the resistance of one of said conductors between said first of said test positions and said fault.

* * * * *